(12) United States Patent
Hosomi et al.

(10) Patent No.: US 6,768,197 B2
(45) Date of Patent: Jul. 27, 2004

(54) HARDENING FLUX, SOLDERING RESIST, SEMICONDUCTOR PACKAGE REINFORCED BY HARDENING FLUX, SEMICONDUCTOR DEVICE AND METHOD OF PRODUCING SEMICONDUCTOR PACKAGE AND SEMICONDUCTOR DEVICE

(75) Inventors: Takeshi Hosomi, Fujieda (JP); Ryouichi Okada, Yokohama (JP); Kensuke Nakamura, Yokohama (JP); Toyosei Takahashi, Utsunomiya (JP)

(73) Assignee: Sumitomo Bakelite Company, LTD, Tokyo (JP)

( * ) Notice: Subject to any disclaimer, the term of this patent is extended or adjusted under 35 U.S.C. 154(b) by 218 days.

(21) Appl. No.: 10/168,645

(22) PCT Filed: Dec. 27, 2000

(86) PCT No.: PCT/JP00/09346

§ 371 (c)(1),
(2), (4) Date: Jun. 24, 2002

(87) PCT Pub. No.: WO01/47660

PCT Pub. Date: Jul. 5, 2001

(65) Prior Publication Data

US 2003/0060043 A1 Mar. 27, 2003

(30) Foreign Application Priority Data

Dec. 27, 1999 (JP) ............................................ 11-371774
Jan. 27, 2000 (JP) ....................................... 2000-019346

(51) Int. Cl.⁷ ............................................... H01I 23/48

(52) U.S. Cl. ......................... 257/737; 257/772; 438/689
(58) Field of Search .................................. 257/737, 772, 257/728, 779, 784, 788; 438/689, 127

(56) References Cited

U.S. PATENT DOCUMENTS 5,128,746 A     7/1992  Pennisi et al. ................. 357/72
6,217,987 B1 *  4/2001  Ono et al. ................... 428/209

FOREIGN PATENT DOCUMENTS

JP        8-90283      4/1996

* cited by examiner

*Primary Examiner*—David Nelms
*Assistant Examiner*—Thinh T Nguyen

(57) ABSTRACT

A curable flux which works as a flux during soldering and as a reinforcing material for the soldered portion after being cured by heating; a resist for soldering which coats a circuit pattern having a land for placing solder balls and is cured by heating after the soldering; a semiconductor package and a semiconductor device in which the curable flux is used for soldering and the soldered portion is reinforced with the flux by heating; processes for producing a semiconductor package and a semiconductor device comprising using the curable flux for soldering and curing the curable flux after the soldering to reinforce the soldered portion. The curable flux works as a flux during bonding solder balls to the semiconductor package and soldering the package to a printed circuit board and reinforces the soldered portion after being cured by heating after the soldering.

36 Claims, No Drawings

US 6,768,197 B2

HARDENING FLUX, SOLDERING RESIST, SEMICONDUCTOR PACKAGE REINFORCED BY HARDENING FLUX, SEMICONDUCTOR DEVICE AND METHOD OF PRODUCING SEMICONDUCTOR PACKAGE AND SEMICONDUCTOR DEVICE

TECHNICAL FIELD

The present invention relates to a curable flux, a resist for soldering, a semiconductor package reinforced with the curable flux, a semiconductor device reinforced with the curable flux and processes for producing the semiconductor package and the semiconductor device. More particularly, the present invention relates to a curable flux which works as a flux during bonding of solder balls to a semiconductor package and bonding of the semiconductor package to a printed circuit board with solder and reinforces the soldered portion after being cured by heating after the soldering, a semiconductor package and a semiconductor device reinforced with the curable flux and processes for producing the semiconductor package and the semiconductor device.

BACKGROUND ART

As the electronic instruments are recently exhibiting higher functions and having lighter weights and smaller sizes, electronic members are more highly integrated and mounted in the instruments in a higher density. Semiconductor packages are becoming smaller and having a greater number of pins.

Since semiconductor packages of the conventional form using lead frames are approaching the limit of improvement, novel forms of packages of the area mounting type such as the ball grid array (BGA) and the chip scale package (CSP) are proposed as the package having chips mounted on a circuit substrate. In the semiconductor packages, various methods such as the tape automated bonding (TAB) method and the flip chip (FC) method are practically used as the method for electrically connecting electrodes of a semiconductor chip with terminals of a substrate which is constituted with various types of insulating materials such as plastics and ceramics and electrically conductive wiring, i.e., a substrate called a printed circuit board. Recently, many structures of BGA and CSP using the FC method are proposed since these structures are advantageous for decreasing the size of the semiconductor package.

For mounting BGA and CSP to a printed circuit board, soldering using a bump formed by solder balls is used. For the soldering, a flux is used and a solder paste is used occasionally in combination. In particular, the solder ball is used because the amount of supplied solder can be easily controlled and a higher bump can be formed by supplying the solder ball in a greater amount. The soldering is frequently used for electric and mechanical bonding between electrodes of a semiconductor chip and terminals of a printed circuit board in the process for producing BGA and CSP.

In general, a flux for soldering is used in the soldering. By using the flux, foul substances such as oxides on the surface of a metal of an electrode faced to the surface of the solder are removed and the surface of the metal is prevented from being oxidized again during the soldering so that the surface tension of the solder is decreased and the melted solder can wet the surface of the metal easily. As the flux for soldering, heretofore, a flux prepared by adding an activator for removing oxide films to a thermoplastic resin-based flux such as rosin has been used.

However, when the flux is left remaining after the soldering, a problem arises in that electric insulation is adversely affected and corrosion of the printed wiring takes place due to melting of the thermoplastic resin and isolation of active ions in the activator in the condition of a high temperature and a high humidity. To overcome the problem, currently, the residual flux after the soldering is removed by washing. However, the washing has a drawback in that the detergent causes a problem in the environment and the cost increases due to the washing step.

As described above, the function of the flux is to remove oxides on the surfaces of the solder and the metal, to prevent the surface from being oxidized again and to improve the wetting property with the solder. When the flux is present and the surface of the metal is exposed, the entire portions of the surface are wetted with the solder without restriction. Therefore, in general, a solder resist is used on the surface of circuits in a semiconductor package or a printed circuit board so that the introduction of the solder is limited to the soldering portion and the pattern of the electrically conductive wiring pattern is protected. However, when the solder resist is left remaining in the soldering portion, problems arise in that the reliability of the bonding deteriorates and the bonding by the soldering fails. Therefore, the solder resist must be formed with a great care.

As the semiconductor package becomes smaller and has a greater number of pins, bumps become smaller and there is the possibility that the strength and the reliability of the bonded portion decrease. To increase the reliability of the portion bonded with bumps, it is studied that the portion bonded with bumps is sealed and reinforced by filling the gap between a semiconductor chip and a substrate with an insulating resin called an underfill. However, this method has a problem in that a step of filling the gap with the underfill and curing the under fill is necessary and this step requires a sophisticated technology. The production process becomes complicated and the cost increases.

The present invention has an object of providing a curable flux which works as a flux during bonding of solder balls to a semiconductor package and bonding of the semiconductor package to a printed circuit board with solder and reinforces the soldered portion after being cured by heating after the soldering, a semiconductor package reinforced with the curable flux, a semiconductor device reinforced with the curable flux and processes for producing the semiconductor package and the semiconductor device.

DISCLOSURE OF THE INVENTION

As the result of extensive studies by the present inventors to achieve the above object, it was found that, in the mounting of a semiconductor package, a composition comprising a resin having a phenolic hydroxyl group and a curing agent for the resin exhibited an excellent property as the flux for soldering, did not require removing the flux after the soldering and worked as a reinforcing material of a semiconductor device when the flux was cured by heating. The present invention has been completed based on this knowledge.

The present invention provides:

(1) A curable flux which works as a flux during soldering and as a reinforcing material for a soldered portion after being cured by heating;

(2) A curable flux described in (1), which comprises resin (A) having phenolic hydroxyl group and curing agent (B) for the resin;

(3) A curable flux described in (2), wherein resin (A) having phenolic hydroxyl group is a phenol novolak resin, an alkylphenol novolak resin, a polyhydric phenol novolak resin, a phenol aralkyl resin, a resol resin or a polyvinylphenol;

(4) A curable flux described in (3), wherein a polyhydric phenol constituting the polyhydric phenol novolak resin is catechol, resorcinol, hydroquinone, hydroxyhydroquinone or pyrogallol;

(5) A curable flux described in (2), wherein resin (A) having phenolic hydroxyl group has a softening point of 30 to 150° C.;

(6) A curable flux described in (2), wherein curing agent (B) is an epoxy compound or an isocyanate compound;

(7) A curable flux described in (2), which further comprises curable antioxidant (C);

(8) A curable flux described in (7), wherein curable antioxidant (C) is a compound having benzylidene structure;

(9) A curable flux described in (8), wherein the compound having benzylidene structure is a compound represented by general formula [1]:

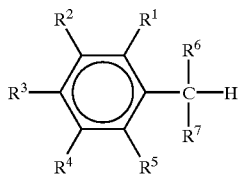

wherein $R^1$, $R^3$ and $R^5$ each independently represent hydrogen atom, hydroxyl group or carboxyl group, $R^2$ and $R^4$ each independently represent hydrogen atom or an alkyl group, $R^6$ and $R^7$ each independently represent hydrogen atom, methyl group, hydroxyphenyl group or carboxyphenyl group;

(10) A curable flux described in (9), wherein the compound represented by general formula [1] is ethylidenediphenol or phenolphthalin;

(11) A curable flux described in (7), wherein curable antioxidant (C) is 4,4'-ethylidenebisphenyl glycidyl ether;

(12) A curable flux described in (1), which comprises compound (D) having phenolic hydroxyl group and dispersed as fine crystals and curing agent (E) for compound (D);

(13) A curable flux described in (12), wherein the fine crystals have a diameter of 50 μm or smaller;

(14) A curable flux described in any one of (2) and (12), wherein a contact angle between the flux in a melted condition and a surface of a solder is 5 to 60°;

(15) A curable flux described in any one of (2) and (12), which has a melt viscosity of 0.1 mPa·s to 50 Pa·s at a temperature during soldering;

(16) A curable flux described in any one of (2) and (12), which has a gel time of 1 to 60 minutes at a melting point of a solder;

(17) A resist for soldering which is applied to coat a circuit pattern having a land for placing solder balls, is cured by heating after soldering with the solder balls by solder reflow and works as a resist for the circuit pattern;

(18) A resist for soldering described in (17), which is cured by heating into a form such that the cured resist reinforces a portion soldered with the solder ball;

(19) A semiconductor package which comprises a curable flux described in any of (1) to (16) which is applied to coat an exposed surface of a circuit, works as a flux of soldering during soldering with solder balls and is cured by heating after soldering with the solder balls so that a portion soldered with the solder balls is reinforced with the cured flux;

(20) A semiconductor device which comprises a curable flux described in any of (1) to (16) which is applied to coat a printed circuit board having a land for soldering, works as a flux of soldering during soldering and is cured by heating after the soldering so that a soldered portion is reinforced with the cured flux;

(21) A semiconductor device described in (20), wherein the curable flux forms a ring-shaped meniscus around a portion for soldering during the soldering and is cured by heating after the soldering;

(22) A semiconductor device described in (20), wherein the curable flux is applied to coat an entire surface of the printed circuit board having a land for soldering and is cured by heating after the soldering so that the cured flux works as a resist for the printed circuit board;

(23) A semiconductor device described in (20), wherein the curable flux is applied to coat an entire surface of the printed circuit board having a land for soldering and is cured by heating after the soldering so that a gap between a semiconductor package and the printed circuit board is sealed with the cured flux;

(24) A process for producing a semiconductor package which comprises coating an exposed surface of a circuit with a curable flux described in any of (1) to (16), placing solder balls on the exposed surface, bonding the solder balls to the exposed portion by reflow and curing the curable flux by heating;

(25) A process for producing a semiconductor package which comprises a step of transferring a curable flux described in any of (1) to (16) in a prescribed amount to solder balls and placing the solder balls having the transferred curable flux on a land portion; a step of soldering the solder balls to the land for placing the solder balls by solder reflow and forming a meniscus with the curable flux around a portion soldered with the solder balls; and a step of curing the curable flux by heating so that a structure in which the portion soldered with the solder balls is reinforced with the cured resin is constructed; and

(26) A process for producing a semiconductor apparatus which comprises applying a curable flux described in any of (1) to (16) to coat a printed circuit board, placing on the board a semiconductor package having solder balls on an electrode portion of a chip, bonding the solder balls to a land of the board by reflow and curing the curable flux by heating.

THE MOST PREFERRED EMBODIMENT TO CARRY OUT THE INVENTION

The curable flux of the present invention works as a flux during the soldering and then as a reinforcing material after being cured by heating. By using the curable flux of the present invention, substances affecting adversely such as oxides on the surfaces of soldering and in the solder are removed so that the surface of soldering is protected and the soldering material is purified so that an excellent bonding having a great strength can be formed. It is not necessary that the curable flux of the present invention is removed by washing. When the flux is heated without additional treatments, the flux is converted into a three-dimensionally crosslinked resin which works as a material reinforcing the soldered portion.

The curable flux of the present invention can be constituted with resin (A) having phenolic hydroxyl group and curing agent (B) for the resin. Resin (A) having phenolic hydroxyl group used in the present invention is not particularly limited. Examples of the resin include phenol novolak resins, alkylphenol novolak resins, polyhydric phenol novolak resins, phenol aralkyl resins, resol resins and polyvinylphenol resins.

The phenol novolak resin, the alkylphenol novolak resin and the polyhydric phenol novolak resin can be obtained by condensation of phenol, an alkylphenol and a polyhydric phenol, respectively, with formaldehyde in the presence of a catalyst. Examples of the alkylphenol used in the present invention include phenols substituted with alkyl groups such as cresol and xylenol and compounds in which hydroxyphenol groups are bonded to alkylidene groups or cycloalkylidene group such as 4,4'-isopropylidenediphenol (bisphenol A) and 4,4'-cyclohexylidenediphenol. Examples of the polyhydric phenol used in the present invention include catechol, resorcinol, hydroquinone, hydroxyhydroquinone and pyrogallol. Among these polyhydric phenols, catechol and resorcinol are preferable. The phenol aralkyl resin can be obtained by the reaction of removing methanol from $\alpha,\alpha'$-dimethoxy-p-xylene and phenol in the presence of an acidic catalyst. The resol resin can be obtained by the reaction of phenol and formaldehyde in the presence of an alkaline catalyst.

It is preferable that resin (A) having phenolic hydroxyl group which is used in the present invention has a softening point of 30 to 150° C. and more preferably 40 to 110° C. When the resin has a softening point lower than 30° C., the molecular weight of the resin is low and there is the possibility that the soldering is adversely affected due to loss of the effect of the flux by vaporization before or during reflow and due to defective bonding caused by formation of voids. A resin having a low molecular weight further has the possibility that sufficient physical properties as the cured resin reinforcing the soldered portion cannot be obtained. When the softening point of the resin exceeds 150° C., there is the possibility that the contact of the solder with the metal of the electrode is adversely affected due to a decrease in fluidity of the curable resin during the soldering and spreading the solder over the surface of the metal of the solder to wet the surface during the soldering is also adversely affected. These phenomena may cause poor bonding with the solder. When the resin has a softening point of 30 to 150° C., sufficient fluidity as the curable flux can be obtained at the temperature of reflow in the soldering and the stable property for soldering can be surely obtained.

In the present invention, it is preferable that resin (A) having phenolic hydroxyl group has a weight-average molecular weight of 20,000 or smaller, more preferably 10,000 or smaller and most preferably 5,000 or smaller. When the weight-average molecular weight exceeds 20,000, there is the possibility that fluidity of the curable flux decreases during the soldering and the soldering is adversely affected.

In the curable flux of the present invention, it is preferable that the content of resin (A) having phenolic hydroxyl group is 20 to 80% by weight and more preferably 25 to 60% by weight of the entire curable flux. When the content of resin (A) is smaller than 20% by weight, there is the possibility that the function of removing foul substances such as oxides on the surface of the solder and the metal decreases and the bonding with the solder is adversely affected. When the content of resin (A) exceeds 80% by weight, there is the possibility that a cured product having a sufficient physical properties cannot be obtained and the strength of the bonding and the reliability decrease.

Since the phenolic hydroxyl group in resin (A) having phenolic hydroxyl group which is used in the present invention removes foul substances such as oxides on the surface of the solder and the metal by the reducing ability of the group, resin (A) having phenolic hydroxyl group works effectively as the flux of soldering. It is preferable that resin (A) having phenolic hydroxyl group has an electron donating group so that the function as the flux in the soldering is enhanced. Since the polyhydric phenol novolak resin has two or more phenolic hydroxyl groups on one benzene ring, the polyhydric phenol novolak exhibits a remarkably improved property as the flux for soldering from that of monohydric phenol novolak resins.

In the present invention, examples of curing agent (B) for resin (A) having phenolic hydroxyl group include epoxy compounds and isocyanate compounds. Examples of the epoxy compound and the isocyanate compound include phenol-based epoxy compounds and phenol-based isocyanate compounds such as bisphenol-based compounds, phenol novolak-based compounds, alkylphenol novolak-based compounds, bisphenol-based compounds, naphthol-based compounds and resorcinol-based compounds; and modified epoxy compounds and modified isocyanate compounds which are modified based on the skeleton structure of aliphatic structures, alicyclic structures and unsaturated aliphatic structures.

In the present invention, it is preferable that the content of curing agent (B) is such that the amount by equivalent of the reactive functional group such as the epoxy group and isocyanate group in the curing agent is 0.5 to 1.5 times and more preferably 0.8 to 1.2 times the amount by equivalent of phenolic hydroxyl group in resin (A). When the amount by equivalent of the reactive functional group in the curing agent is less than 0.5 times the amount by equivalent of phenolic hydroxyl group, there is the possibility that a cured product having the sufficient physical properties cannot be obtained and the bonding strength and the reliability are adversely affected due to a decrease in the reinforcing effect. When the amount by equivalent of the reactive functional group in the curing agent exceeds the amount 1.5 times the amount by equivalent of phenolic hydroxyl group, the function of removing foul substances such as oxides on the surface of the solder and the metal decreases and there is the possibility that the bonding property of the solder becomes insufficient.

It is not necessary that the curable flux of the present invention is removed by washing after the soldering since a cured product having excellent physical properties can be formed by the reaction of resin (A) having phenolic hydroxyl group and curing agent (B). The soldered portion is protected by the cured product and the electric insulation is maintained under the condition of a high temperature and a high humidity. Therefore, soldering exhibiting a high bonding strength and excellent reliability can be achieved.

The curable flux of the present invention may comprise curable antioxidant (C). The curable antioxidant is a compound which works as an antioxidant and can be cured by the reaction with curing agent (B). The curable antioxidant comprised in the curable flux is not particularly limited. Compounds having benzylidene structure are preferable and compounds represented by general formula [1] and 4,4'-ethylidenebisglycidyl ether are more preferable.

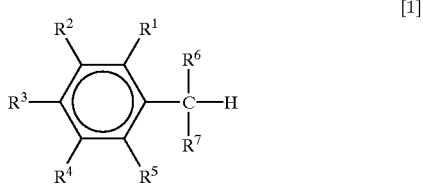

In the above general formula [1], $R^1$, $R^3$ and $R^5$ each independently represent hydrogen atom, hydroxyl group or carboxyl group, $R^2$ and $R^4$ each independently represent hydrogen atom or an alkyl group, $R^6$ and $R^7$ each independently represent hydrogen atom, methyl group, hydroxyphenyl group or carboxyphenyl group.

Examples of the compound represented by general formula [1] include ethylidenediphenol, 2,2'-ethylidenebis(4,6-di-t-butylphenol), phenolphthalin and polymers derived from these compounds. The above compounds may be used singly or in combination of two or more. Among the above compounds, ethylidenediphenol and phenolphthalin are preferable.

In the curable flux of the present invention, it is preferable that the content of curable antioxidant (C) is 0.5 to 30% by weight and more preferably 1 to 20% by weight of the entire amount of the curable flux. When the content of the curable antioxidant is smaller than 0.5% by weight, there is the possibility that the function of the antioxidant at the ordinary temperature and the function of removing foul substances such as oxides on the surface of the solder and the metal decrease and the bonding property of the solder is not sufficiently exhibited. When the content of the curable antioxidant exceeds 30% by weight, there is the possibility that reliability of the insulating property and the bonding strength deteriorates.

The benzylidene structure effectively works as the antioxidant since this structure catches radicals formed by oxidation and contributes to termination of the chain of oxidation. In the temperature region during the soldering, the benzylidene structure works as a reducing agent by releasing hydrogen radical and removes foul substances such as oxides on the surface of the solder and the metal.

The curable flux of the present invention may comprise compound (D) having phenolic hydroxyl group and dispersed as fine crystals and curing (E) agent for compound (D). Among the compounds having phenolic hydroxyl group, compounds having very strong reducing ability and exhibiting a very strong effect as the reflux occasionally exhibit undesirable effects. When such a compound is dissolved in the curable flux as a component, problems occasionally arise in that thermal stability of the curable flux decreases and the period of time which can be used (the life) decreases and that the hygroscopic property of the curable flux is enhanced and foaming takes place by vaporization of absorbed water during the soldering. These problems arise since the compound is dissolved and phenolic hydroxyl group is in a relatively free condition. When the compound having phenolic hydroxyl group is dispersed as fine crystals, the movement of hydroxyl group is restricted due to interactions between molecules and the hydrogen bond in the crystalline state and the above problems can be minimized. Moreover, when the compound having phenolic hydroxyl group is dispersed as fine crystals, the possibility that phenolic hydroxyl group contacts with curing agent (E) and lost by the reaction decreases. Therefore, a major portion of phenolic hydroxyl group remains unchanged and the effect of the flux in the soldering increases. It is preferable that the fine crystals of the compound having phenolic hydroxyl group has a diameter of 50 μm or smaller. When the diameter of the fine crystals exceeds 50 μm, there is the possibility that the activity is not exhibited uniformly since the surface of a coating film is not smooth and the fine crystals are not uniformly distributed.

Examples of compound (D) having phenolic hydroxyl group and dispersed as fine crystals include phenol, alkylphenols, biphenols, naphthols, hydroquinone, resorcinol, catechol, methylidenediphenol, ethylidenediphenol, isopropylidenediphenol, hydroxybenzoic acid, dihydroxybenzoic acid and phenolphthalin.

Examples of curing agent (E) for compound (D) having phenolic hydroxyl group include phenol-based epoxy resins and phenol-based isocyanate resins such as bisphenol-based resins, phenol novolak-based resins, alkylphenol novolak-based resins, biphenol-based resins, naphthol-based resins and resorcinol-based resins; and modified epoxy resins and modified isocyanate resins which are modified based on the skeleton structure of aliphatic structures, alicyclic structures and unsaturated aliphatic structures. A conventional curing agent may be used to promote the curing.

Compound (D) having phenolic hydroxyl group and dispersed as fine crystals may be dispersed in curing agent (E). Compound (D) having phenolic hydroxyl group can be dispersed as fine crystals by dissolving compound (D) having phenolic hydroxyl group into a polar solvent exhibiting a great solubility such a ketone, followed by quickly adding the resultant solution into a great amount of a poor solvent so that crystals are separated very quickly. When curing agent (E) is a liquid, the obtained dispersion can be used without further treatments. When curing agent (E) is a solid, the dispersion is mixed with a solution obtained by dissolving curing agent (E) into a solvent having a boiling point of 150° C. or higher and the obtained mixture is mixed by using a three-roll mixer or the like apparatus to form the desired dispersion.

In the curable flux of the present invention, it is preferable that the content of compound (D) having phenolic hydroxyl group and dispersed as fine crystals is such that the amount by equivalent of hydroxyl group is 0.5 to 1.1 times and more preferably 0.7 to 1 time the amount by equivalent of the functional group in curing agent (E). When the amount by equivalent of hydroxyl group in the compound having phenolic hydroxyl group is less than 0.5 times the amount by equivalent of the functional group in the curing agent, there is the possibility that the function of removing foul substances such as oxides on the surface of the solder and the metal decreases and the bonding obtained by the soldering is not sufficiently improved. When the amount by equivalent of hydroxyl group in the compound having phenolic hydroxyl group exceeds the amount 1.1 times the amount by equivalent of the functional group in the curing agent, there is the possibility that a cured product having the sufficient physical properties cannot be obtained and the bonding strength and the reliability are adversely affected.

It is preferable that the curable flux of the present invention has a contact angle between the flux in the melted condition and the surface of the solder of 5° or greater, more preferably 10° or greater and most preferably 15° or greater. When the contact angle is smaller than 5°, there is the possibilities that the thickness of the meniscus formed around the soldering portion is small and the reinforcement with the resin is insufficient and that the entire surface of the solder is covered with the cured product of the curable flux due to the property excessively wetting the solder and the property for the secondary mounting markedly deteriorates. For example, to surely obtain a bonding strength in a soldered portion having a diameter of a land of 0.3 mm which is twice the strength in other portions or greater, it is preferable that the contact angle is 15° or greater. The upper limit of the contact angle cannot be generally decided since the reinforcing effect of the resin is different depending on the amount of the curable flux. In general, it is preferable that the contact angle is 60° or smaller. When the contact angle exceeds 60°, there is the possibility that, when the amount of the curable flux is small, the height of the meniscus is insufficient due to the insufficient property of wetting the solder and the reinforcement with the resin is insufficient. The meniscus means the curable flux in the condition such that the melted curable flux surrounds the soldering portion in a ring shape and wets the surface of the solder as a protrusion or in the condition such that the flux in the above condition is cured.

It is preferable that the curable flux of the present invention has a contact angle between the flux in the melted condition and the surface of the substrate of 45° or smaller. When the contact angle between the flux and the surface of the substrate exceeds 45°, there is the possibility that the flux aggregates in the melted condition during the soldering and the formation of a uniform resist layer becomes difficult. To make the flux function as the protective resist of a circuit pattern, the wetting property and the surface tension between the curable flux and the surface of the substrate to be coated with the curable flux are important. By decreasing the surface tension by adding a leveling agent to the curable flux, the contact angle with the surface of the substrate can be adjusted and a uniform resist layer can be formed.

It is preferable that the curable flux of the present invention has a melting point of 100° C. or lower. When the resin contained in the curable flux has a high molecular weight and the melting point exceeds 100° C., there is the possibility that fluidity of the curable flux decreases during the soldering and the soldering is adversely affected.

It is preferable that the curable flux of the present invention has a melt viscosity of 0.1 mPa·s or greater at the temperature of the soldering. When the melt viscosity at the temperature of the soldering is smaller than 0.1 mPa·s, there is the possibility that the reinforcing structure having the ring shape around the soldering portion is small and the effect of reinforcing the bonding strength decreases. In an extreme case, there is the possibility that the curable flux is vaporized or flows out during the soldering. It is preferable that the curable flux of the present invention has a melt viscosity of 50 Pa·s or smaller, more preferably 5 Pa·s or smaller and most preferably 0.5 Pa·s or smaller at the temperature of the soldering. When the melt viscosity at the temperature of the soldering exceeds 50 Pa·s, there is the possibility that fluidity of the curable flux decreases and the soldering is adversely affected. When the melt viscosity at the temperature of the soldering is 5 Pa·s or smaller, the curable flux can be applied to a solder or a surface which is markedly oxidized or has a poor wetting property. When the melt viscosity at the temperature of the soldering is 0.5 Pa·s or smaller, the property of sufficient self alignment of solder balls can be expected and the effect of the flux can be extended to a wide range of the bonding area by utilizing flow of the melted solder.

It is preferable that the gel time of the curable flux of the present invention at the melting point of the solder is 1 minute or longer, more preferably 2 minutes or longer and most preferably 5 minutes or longer. When the gel time at the melting point of the solder is shorter than 1 minute, there is the possibility that the curable flux is cured before the solder and the metal for the bonding are bonded to each other due to the curing reaction taking place during the reflow of the solder and the soldering is adversely affected. When the gel time at the melting point of the solder is 5 minutes or longer, fluidity of the curable flux at the temperature of the soldering can be surely maintained and stable soldering can be achieved. It is preferable that the gel time at the melting point of the solder is 60 minutes or shorter, more preferably 30 minutes or shorter and most preferably 20 minutes or shorter. When the gel time at the melting point of the solder exceeds 60 minutes, there is the possibility that the curing by heating does not proceed sufficiently and the sufficient reinforcing effect of the soldered portion cannot be achieved although stable soldering by the solder reflow can be achieved. When the curing is conducted at a high temperature to make the curing reaction to proceed sufficiently, there is the possibility that toughness in fracture of the cured product decreases by oxidation of the curable flux and impact resistance under heating decreases after the mounting.

The curable flux of the present invention can be used as a varnish of the curable flux by adding solvent (F). It is preferable that solvent (F) has a boiling point of 100° C. or higher. When the boiling point of the solvent is lower than 100° C., there is the possibility that stability of the coating film is insufficient during coating of the curable flux since the change in the viscosity is great when the varnish is left standing at the ordinary temperature and the soldering becomes incomplete due to a decrease in workability and an uneven distribution of the coated varnish. It is preferable that the boiling point of the solvent is 300° C. or lower and more preferably 270° C. or lower under the condition that a cocrystalline solder is used and the peak temperature is 240° C. in the reflow although the preferable boiling point is different depending on the condition of the reflow which is different depending on the composition of the solder. From the standpoint of the amount of the residual solvent, it is preferable that the solvent has a low vapor pressure. When the solvent has a boiling point exceeding 300° C., there is the possibility that the soldering is adversely affected and the reliability of the soldering decreases due to an excessively great amount of the residual solvent.

It is preferable that solvent (F) has a great ability of dissolving resin (A) having phenolic hydroxyl group and curing agent (B) for the resin (A). Examples of the solvent include conventional solvents such as alcohols, ethers, acetals, ketones, esters, alcohol esters, ketone alcohols, ether alcohols, ketone ethers, ketone esters and ester ethers. Where necessary, phenols and non-protonic nitrogen compounds can be used. In the curable flux of the present invention, workability in the step of coating with the curable flux can be improved and the stabilization of the cured flux, the control of the amount of coating and the stabilization of the soldering can be achieved by using the curable flux as the varnish by adding solvent (F).

The curable flux of the present invention may comprise a curing catalyst to promote curing of the flux. Examples of the curing catalyst include 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, 2-ethyl-4-methylimidazole, 2-undecylimidazole, 1-cyanoethyl-2-methylimidazole, 1-cyanoethyl-2- phenylimidazole, 1-cyanoethyl-2-ethyl-4-methyl-imidazole, 1-aminoethyl-2-methylimidazole, 1-(cyanoethylaminoethyl)-2-methylimidazole, 1-cyanoethyl-2-phenyl-4, 5-bis(cyanoethoxymethylimidazole) and imidazoles of the triazine addition type. Catalysts formed into adducts of epoxy compounds to the above imidazoles and catalysts formed into microcapsules can also be used. The catalyst may be used singly or in combination of two or more.

The curable flux of the present invention may further comprise silane coupling agents for improving adhesion and moisture resistance, defoaming agents for preventing formation of voids and liquid or powder flame retardants.

The semiconductor package of the present invention comprises the curable flux described above which is applied to coat an exposed surface of a circuit, works as a flux of soldering during soldering with solder balls and is cured by heating after soldering with the solder balls so that the portion soldered with the solder balls is reinforced with the cured flux. The process for producing the semiconductor package comprises coating an exposed surface of a circuit with the curable flux described above, placing solder balls on the exposed surface, bonding the solder balls to the exposed portion by reflow and curing the curable flux by heating. The process for producing the semiconductor package may further comprises a step of transferring the curable flux described above in the prescribed amount to solder balls and placing the solder balls having the transferred curable flux on a land portion; a step of soldering the solder balls to the land for placing the solder balls by solder reflow and forming a meniscus with the curable flux around the portion soldered with the solder balls; and a step of curing the curable flux by heating so that the structure in which the portion soldered with the solder balls is reinforced with the cured resin is constructed.

When the curable flux of the present invention is applied to a semiconductor package having a solder resist, the land portion for placing solder balls is coated with a prescribed amount of the curable flux in advance and the solder balls can be placed on the curable flux on the land portion. In another method, a prescribed amount of the curable flux is transferred to solder balls and the solder balls having the transferred curable flux can be placed on the land portion. As still another method, the entire surface of the circuit pattern for placing solder balls in the semiconductor package may be coated with the curable flux in accordance with the screen printing or the spin coating and, after the coated flux is dried, solder balls can be placed on the land for placing solder balls in the circuit pattern. When the curable flux is used also as the resist for the circuit pattern, the entire surface of the circuit pattern is coated with the curable flux without forming a solder resist on the semiconductor package. Thereafter, the solder balls are bonded to the land portion by solder reflow and, at the same time, a meniscus is formed around the portion for the soldering. The curable flux is cured by heating and the soldered portion is reinforced with the resin.

The semiconductor device of the present invention comprises the curable flux described above which is applied to coat a printed circuit board having a land for soldering, works as a flux of soldering during soldering and is cured by heating after the soldering so that the soldered portion is reinforced with the cured flux. The process for producing a semiconductor apparatus of the present invention comprises applying the curable flux described above to coat a printed circuit board, placing on the board a semiconductor package having solder balls on an electrode portion of a chip, bonding the solder balls to a land of the board by reflow and curing the curable flux by heating.

In the first embodiment of the semiconductor device of the present invention, the curable flux forms a ring-shaped meniscus around the portion for soldering during the soldering and is cured by heating after the soldering. The curable flux is applied to coat a circuit pattern having a land for soldering. The coating flux works as the flux for soldering and forms a ring-shaped meniscus around the portion for the soldering during the soldering. The curable flux is then cured by heating and works as the reinforcing material for the soldered portion.

In the second embodiment of the present invention, the curable flux is applied to coat the entire surface of the printed circuit board having a land for soldering and is cured by heating after the soldering so that the cured flux works as the resist for the printed circuit board. The curable flux is applied to coat the entire surface of the circuit pattern having a land for soldering. The coating flux works as the flux for soldering during the soldering. The curable flux is then cured by heating and works as the resist for the circuit pattern.

In the third embodiment of the present invention, the curable flux is applied to coat the entire surface of the printed circuit board having a land for soldering and is cured by heating after the soldering so that a gap between a semiconductor package and the printed circuit board is sealed with the cured flux. The curable flux is applied to coat the entire surface of the circuit pattern having the land portion for soldering so that a film having a thickness about the same as that of the solder balls is formed. The curable flux works as the flux for soldering during the soldering. The flux is then cured by heating and works as the sealant.

In accordance with the present invention, formation of a solder resist, removal of the residual flux after the soldering and filling with an underfill are not necessary and the soldering which maintains the electric insulating property under the atmosphere of a high temperature and a high humidity and exhibits a great bonding strength and excellent reliability can be achieved.

The curable flux of the present invention exhibits an excellent balance in the melt viscosity, the property to remove oxides and the curing property, works as the flux during the soldering and can be cured in a manner such that the soldered portion is reinforced in a ring shape by forming a meniscus. Therefore, the bonding strength and the reliability can be remarkably improved from those obtained by soldering using a conventional flux.

By using the curable flux of the present invention, the bonding by soldering and the reinforcement with the resin can be simultaneously achieved in the production of a semiconductor package having solder balls for mechanically and electrically bonding a package with a printed circuit board and a semiconductor package exhibiting excellent properties can be obtained. When members having a solder bump for mechanical and electric bonding are mounted on a printed circuit board, the solder bump can be bonded with a great shear strength of the solder balls and the excellent resistance to temperature cycles and the excellent insulating property can be provided by the reinforcement with the resin.

The present invention will be described more specifically with reference to examples in the following. However, the present invention is not limited to the examples.

EXAMPLE 1

Into 60 g of cyclohexanone, 100 g of a m,p-cresol novolak resin [manufactured by NIPPON KAYAKU Co., Ltd.; PAS-1; the hydroxyl equivalent: 120] and 140 g of an epoxy resin of the bisphenol F type [manufactured by NIPPON KAYAKU Co., Ltd.; RE-404S; the epoxy equivalent: 165] were dissolved. To the resultant solution, 0.2 g of 2-phenyl-4,5-dihydroxymethylimidazole as the curing catalyst was added and a varnish of a curable flux was prepared.

Using a copper plate having a thickness of 125 µm [manufactured by FURUKAWA DENKI KOGYO Co., Ltd.; EFTEC64T], a test circuit having a land having a diameter of 400 µm and a pitch of 1 mm was formed. A lead frame of the circuit was sealed by molding with a sealing material for semiconductors [manufactured by SUMITOMO BAKELITE Co., Ltd.; EME-7372]. One face of the test circuit board was polished so that the test circuit was exposed and a test package of 20 mm square was prepared. For the polishing, a water-resistant polishing paper No. 1000 in accordance with Japanese Industrial Standard R 6253 was used. The test package was cleaned with isopropyl alcohol, dried at 80° C. for 30 minutes and used as the test package for evaluation of soldering.

The surface of the test package for evaluation of soldering having the exposed test circuit was entirely coated with the varnish of a curable flux prepared above. The coating flux was dried at 80° C. for 10 minutes and a film of the curable flux having a thickness of 20 µm was formed. On the land of the circuit of the test package for evaluation of soldering, 60 solder balls having a diameter of 500 µm [manufactured by SENJU KINZOKU KOGYO Co., Ltd.; an Sn—Pb-based cocrystalline solder] were placed. The solder balls were bonded to the test package for evaluation of soldering by passing through a reflow oven in which the peak temperature was set at 240° C. Then, the curable flux was cured by the heat treatment at 150° C. for 60 minutes and the structure reinforced with the resin was completed. A ring-shaped meniscus having a height of 150 to 200 µm was formed around the soldered portion.

The shear strength of the solder balls in the obtained test package for evaluation of soldering was measured by using a universal bond tester [manufactured by DAISY Company; PC2400T]. The average value obtained from 60 measurements was 1,100 g.

The same test was conducted using a test circuit having a land having a diameter of 30 µm and a pitch of 0.8 µm and the average value of the shear strength of the solder balls was 1,000 g.

Ten test printed circuit boards for the test of temperature cycles were coated with a commercial flux [manufactured by KYUSHU MATSUSHITA DENKI Co., Ltd.; MSP511]. After the test packages having solder balls prepared as described above were mounted, the resultant combinations were passed through a reflow oven in which the peak temperature was set at 240° C. and 10 substrates mounted with the test package were prepared. The substrates mounted with the test package had a circuit designed in a manner such that 60 bonding portions with the solder balls were connected in series via the test package and the test printed circuit board.

After it was confirmed that electric current passed through the substrates mounted with the test package obtained above, the test of temperature cycles was conducted. In the test of temperature cycles, each cycle was composed of a treatment at −50° C. for 10 minutes and a treatment at 125° C. for 10 minutes. After 1,000 cycles of the test of temperature cycles, no defects of broken wiring were found in the 10 substrates mounted with the test package.

A test printed circuit board which had been plated with a solder and had a pattern of a comb shape having a distance between electric conductors of 150 µm was coated with the varnish of a curable flux prepared above. The coating varnish was dried at 80° C. for 10 minutes and a film of the curable flux having a thickness of 20 µm was formed. The obtained printed circuit board was passed through a reflow oven in which the peak temperature was set at 240° C. Then, the curable flux was cured by the heat treatment at 150° C. for 60 minutes and a test printed circuit board for the test of reliability of insulation was obtained.

The insulation resistance between the patterns of a comb shape having a distance between electric conductors of 150 µm in the printed circuit board was measured using an automatic ultra insulation-resistance tester [manufactured by ADVANTEST Company] by applying a voltage of 100 V for 1 minute. The resistance was $4 \times 10^{12}$ Ω. Then, a direct current voltage of 50 V was applied under the atmosphere of 85V and 85% RH. After the test printed circuit was kept in this condition for 1,000 hours, the insulation resistance was measured in accordance with the same method. No change in the insulation resistance was found and the insulation resistance was $4 \times 10^{12}$ Ω.

The melt viscosity of the curable flux was measured using a viscometer [manufactured by RHEOMETRICS Corp.] while the temperature was elevated by heating. The melt viscosity at the temperature of the soldering of 240° C. was 0.02 Pa·s. The contact angle between the curable flux in the melted condition and the surface of the solder was 25°.

EXAMPLE 2

A varnish of a curable flux was prepared and evaluated in accordance with the same procedures as those conducted in Example 1 except that 100 g of a bisphenol A novolak resin [manufactured by DAINIPPON INK KAGAKU Co., Ltd.; LF4781; the hydroxyl equivalent: 120] was used in place of 100 g of the m,p-cresol novolak resin.

The average value of the shear strength of the solder balls was 1,000 g when the land had a diameter of 400 µm and 950 g when the land had a diameter of 300 µm. No defects were found in the test of temperature cycles. In the test of insulation resistance, the insulation resistance was $5 \times 10^{12}$ Ω before the test and $4 \times 10^{12}$ Ω after the test.

The melt viscosity of the curable flux at the temperature of the soldering was 0.05 Pa·s and the contact angle between the curable flux in the melted condition and the surface of the solder was 25°.

EXAMPLE 3

A varnish of a curable flux was prepared and evaluated in accordance with the same procedures as those conducted in Example 1 except that 100 g of a polyvinylphenol [manufactured by MARUZEN SEKIYU KAGAKU Co., Ltd.; MARUKALINKER M; the hydroxyl equivalent: 120] was used in place of 100 g of the m,p-cresol novolak resin.

The average value of the shear strength of the solder balls was 1,050 g when the land had a diameter of 400 µm and 900 g when the land had a diameter of 300 µm. No defects were found in the test of temperature cycles. In the test of insulation resistance, the insulation resistance was $5 \times 10^{12}$ Ω before the test and $4 \times 10^{12}$ Ω after the test.

The melt viscosity of the curable flux at the temperature of the soldering was 0.03 Pa·s and the contact angle between the curable flux in the melted condition and the surface of the solder was 20°.

EXAMPLE 4

Into 80 g of cyclohexanone, 100 g of a phenol novolak resin [manufactured by SUMITOMO DUREZ Co., Ltd.;

PR-51470; the hydroxyl equivalent: 105] and 210 g of an epoxy resin of the diallylbisphenol A type [manufactured by NIPPON KAYAKU Co., Ltd.; RE-810NM; the epoxy equivalent: 220] were dissolved and 0.3 g of 2-phenyl-4,5-dihydroxymethylimidazole was added as the curing catalyst. A varnish of a curable flux was prepared and evaluated in accordance with the same procedures as those conducted in Example 1.

The average value of the shear strength of the solder balls was 1,000 g when the land had a diameter of 400 μm and 850 g when the land had a diameter of 300 μm. No defects were found in the test of temperature cycles. In the test of insulation resistance, the insulation resistance was $4 \times 10^{12}$ Ω before the test and $3 \times 10^{12}$ Ω after the test.

The melt viscosity of the curable flux at the temperature of the soldering was 0.02 Pa·s and the contact angle between the curable flux in the melted condition and the surface of the solder was 20°.

COMPARATIVE EXAMPLE 1

The surface of a test package for evaluation of soldering having the exposed circuit which was the same as that used in Example 1 was coated with a commercial flux [manufactured by KYUSHU MATSUSHITA DENKI Co., Ltd.; MSP511] without forming a solder resist. Then, 60 solder balls were placed and the solder balls were bonded to the test package for evaluation of soldering by passing through a reflow oven in which the peak temperature was set at 240° C. The flux was removed by washing with isopropyl alcohol. In this manner, test packages having solder balls were prepared. The shear strength of the solder balls was measured in accordance with the same method as that used in Example 1. The average value of the shear strength of 60 solder balls was 550 g when the land had a diameter of 400 μm and 350 g when the land had a diameter of 350 μm.

Ten test printed circuit boards for the test of temperature cycles were coated with the commercial flux described above without forming a solder resist. After the test packages having solder balls described above were mounted, the resultant combinations were passed through a reflow oven in which the peak temperature was set at 240° C. The flux was removed by washing with isopropyl alcohol and substrates mounted with the test package were prepared. The test of temperature cycles was conducted using the obtained substrates mounted with the test package in accordance with the same method as that used in Example 1. Defects of broken wiring were found in all of 10 substrates mounted with the test package.

COMPARATIVE EXAMPLE 2

Test packages having solder balls and substrates mounted with the test package for the test of temperature cycles were prepared and evaluated in accordance with the same procedures as those conducted in Comparative Example 1 except that a solder resist was formed on the test packages for the evaluation of soldering and the printed circuit boards for the test of temperature cycles.

The average value of the shear strength of the solder balls was 650 g when the land had a diameter of 400 μm and 400 g when the land had a diameter of 300 μm. Defects of broken wiring were found in 8 of 10 substrates mounted with the test package in the test of temperature cycles.

COMPARATIVE EXAMPLE 3

Substrates mounted with the test package for the test of temperature cycles were prepared and evaluated in accordance with the same procedures as those conducted in Comparative Example 1 except that a solder resist was formed on the test packages for evaluation of soldering and the printed circuit boards for the test of temperature cycles and an underfill was applied after the flux was removed by washing.

Defects of broken wiring were found in 1 of 10 substrates mounted with the test package in the test of temperature cycles.

COMPARATIVE EXAMPLE 4

A test printed circuit board having the same shape and pattern as those in Example 1 was coated with the above commercial flux. The coated board was passed through a reflow oven in which the peak temperature was set at 240° C. and a test printed circuit board for the test of insulation and reliability was prepared.

The test of insulation resistance was conducted using the test printed circuit board prepared above in accordance with the same method as that used in Example 1. The test printed circuit board had an insulation resistance of $6 \times 10^{10}$ Ω before the test and the short circuit was found after the test.

The results in Examples 1 to 4 and Comparative Example 1 to 4 are shown in Table 1.

TABLE 1

| | Shear strength of solder balls | | Test of temperature | Insulation resistance | | Contact | Melt |
|---|---|---|---|---|---|---|---|
| | 400 μm (g) | 300 μm (g) | cycles (defect/total) | before test (Ω) | after test (Ω) | angle (°) | viscosity (Pa.s) |
| Example 1 | 1100 | 1000 | 0/10 | $4 \times 10^{12}$ | $4 \times 10^{12}$ | 25 | 0.02 |
| Example 2 | 1000 | 950 | 0/10 | $5 \times 10^{12}$ | $4 \times 10^{12}$ | 25 | 0.05 |
| Example 3 | 1050 | 900 | 0/10 | $5 \times 10^{12}$ | $4 \times 10^{12}$ | 20 | 0.03 |
| Example 4 | 1000 | 850 | 0/10 | $4 \times 10^{12}$ | $3 \times 10^{12}$ | 20 | 0.02 |
| Comparative Example 1 | 550 | 350 | 10/10 | — | — | — | — |
| Comparative Example 2 | 650 | 400 | 8/10 | — | — | — | — |
| Comparative Example 3 | — | — | 1/10 | — | — | — | — |
| Comparative Example 4 | — | — | — | $6 \times 10^{10}$ | short circuit | — | — |

[Note]
In shear strength of solder balls, 400 μm and 300 μm show the diameter of the land portion.

As shown in Table 1, in Examples in which the curable flux of the present invention was used, the shear strength of solder balls was as high as 1.5 to 1.8 times the values obtained by using the conventional flux. In the test of temperature cycles, no defects of broken wiring were found. In the test of insulation resistance, the resistance showed almost no decrease. It is apparent that the flux of the present invention exhibited the excellent effects.

EXAMPLE 5

Into 80 g of cyclohexanone, 100 g of a resorcinol novolak resin [manufactured by NIPPON KAYAKU Co., Ltd.; KAYAHARD RCN; the hydroxyl equivalent: 58] and 280 g of an epoxy resin of the bisphenol F type [manufactured by NIPPON KAYAKU Co., Ltd.; RE-404S; the epoxy equivalent: 165] were dissolved. To the resultant solution, 0.2 g of 2-phenyl-4,5-dihydroxymethylimidazole was added as the curing catalyst and a varnish of a curable flux was prepared. The prepared varnish was evaluated in accordance with the same procedures as those conducted in Example 1.

The average value of the shear strength of the solder balls was 1,050 g when the land had a diameter of 400 $\mu$m and 800 g when the land had a diameter of 300 $\mu$m. No defects were found in the test of temperature cycles. In the test of insulation resistance, the insulation resistance was $3 \times 10^{12}$ $\Omega$ before the test and $3 \times 10^{12}$ $\Omega$ after the test.

The contact angle between the curable flux in the melted condition and the surface of the solder was 15°.

A copper plate having a thickness of 125 $\mu$m [manufactured by FURUKAWA DENKI KOGYO Co., Ltd.; EFTEC64T] was treated with a soft etching solution [manufactured by NIPPON PEROXIDE Co., Ltd.; FINE POLISHER PO-TG] for 2 minutes and a test copper plate for bonding of solder balls was prepared. The test copper plate for bonding of solder balls was coated with the above varnish of a curable flux to form a film having a thickness of 100 $\mu$m. On the formed film, 5 Sn—Pb-based cocrystalline solder balls having a diameter of 500 $\mu$m [manufactured by NITTETSU MICROMETAL Co., Ltd.] were placed and the copper plate having the solder balls was left standing on a hot plate set at 240° C. After one minute, the copper plate was removed from the hot plate and the height D ($\mu$m) of the solder balls which wetted the plate and spread was measured and the degree of spreading by wetting was calculated using the following equation:

Degree of spreading by wetting (%)=(500−$D$)/5

The degree of spreading by wetting was found to be 80%.

Using solder balls containing no lead in place of the Sn—Pb-based cocrystalline solder balls, the degree of spreading by wetting was calculated in accordance with the same method as that in the above. The degree of spreading by wetting of Sn—Ag—Cu-based solder balls [manufactured by NITTETSU MICROMETAL Co., Ltd.] was 70%, the degree of spreading by wetting of Sn—Bi-based solder balls [manufactured by SENJU KINZOKU KOGYO Co., Ltd.] was 60% and the degree of spreading by wetting of Sn—Zn-based solder balls was 65%.

EXAMPLE 6

A varnish of a curable flux was prepared and evaluated in accordance with the same procedures as those conducted in Example 5 except that 100 g of a catechol novolak resin [manufactured by NIPPON KAYAKU Co., Ltd.; A-1468; the hydroxyl equivalent: 58] was used in place of 100 g of the resorcinol novolak resin.

The average value of the shear strength of the solder balls was 1,100 g when the land had a diameter of 800 $\mu$m and 800 g when the land had a diameter of 300 $\mu$m. No defects were found in the test of temperature cycles. In the test of insulation resistance, the insulation resistance was $3 \times 10^{12}$ $\Omega$ before the test and $3 \times 10^{12}$ $\Omega$ after the test.

The contact angle between the curable flux in the melted condition and the surface of the solder was 10°.

The degree of spreading by wetting of the Sn—Pb-based cocrystalline solder balls was 80%, the degree of spreading by wetting of Sn—Ag—C-based solder balls was 70%, the degree of spreading by wetting of Sn—Bi-based solder balls was 65% and the degree of spreading by wetting of Sn—Zn-based solder balls was 60%.

EXAMPLE 7

A varnish of a curable flux was prepared and evaluated in accordance with the same procedures as those conducted in Example 5 except that 100 g of a hydroquinone novolak resin [manufactured by SUMITOMO DUREZ Co., Ltd.; a tentative product; the hydroxyl equivalent: 55] was used in place of 100 g of the resorcinol novolak resin.

The average value of the shear strength of the solder balls was 1,050 g when the land had a diameter of 800 $\mu$m and 800 g when the land had a diameter of 300 $\mu$m. No defects were found in the test of temperature cycles. In the test of insulation resistance, the insulation resistance was $4 \times 10^{12}$ $\Omega$ before the test and $3 \times 10^{12}$ $\Omega$ after the test.

The degree of spreading by wetting of the Sn—Pb-based cocrystalline solder balls was 80%, the degree of spreading by wetting of Sn—Ag—C-based solder balls was 55%, the degree of spreading by wetting of Sn—Bi-based solder balls was 60% and the degree of spreading by wetting of Sn—Zn-based solder balls was 50%.

The results of Examples 5 to 7 are shown in Table 2.

TABLE 2

| | Shear strength of solder balls | | Test of | Insulation | | |
|---|---|---|---|---|---|---|
| | 400 | 300 | temperature | resistance ($\Omega$) | | Contact |
| | $\mu$m (g) | $\mu$m (g) | cycles (defect/total) | before test ($\Omega$) | after test ($\Omega$) | angle (°) |
| Example 5 | 1050 | 800 | 0/10 | $3 \times 10^{12}$ | $3 \times 10^{12}$ | 15 |
| Example 6 | 1100 | 800 | 0/10 | $3 \times 10^{12}$ | $2 \times 10^{12}$ | 10 |
| Example 7 | 1050 | 800 | 0/10 | $4 \times 10^{12}$ | $3 \times 10^{12}$ | — |

| | Degree of spreading by wetting (%) | | | |
|---|---|---|---|---|
| | Sn—Pb | Sn—Ag—Cu | Sn—Bi | Sn—Zn |
| Example 5 | 80 | 70 | 60 | 65 |
| Example 6 | 80 | 70 | 65 | 60 |
| Example 7 | 80 | 55 | 60 | 50 |

[Note]
In shear strength of solder balls, 400 $\mu$m and 300 $\mu$m show the diameter of the land portion.

As shown in Table 2, in Example 5 to 7 in which the curable flux of the present invention was used, the wetting property to the Sn—Pb-based solder was excellent and the wetting property was excellent also to the solders containing no lead.

EXAMPLE 8

Into 60 g of cyclohexanone, 100 g of a phenol novolak resin [manufactured by SUMITOMO DUREZ Co., Ltd.;

LBR-6; the softening point: 41° C.; the hydroxyl equivalent: 105] and 210 g of an epoxy resin of the diallylbisphenol A type [manufactured by NIPPON KAYAKU Co., Ltd.; RE-810NM; the epoxy equivalent: 225] were dissolved. To the resultant solution, 0.2 g of 2-phenyl-4,5-dihydroxymethylimidazole [manufactured by SHIKOKU KASEI Co., Ltd.; 2PHZ] as the curing catalyst was added and a varnish of a curable flux was prepared. Then, the prepared varnish was evaluated.

The average value of the shear strength of the solder balls was 900 g when the land had a diameter of 300 μm. No defects were found in the test of temperature cycles. In the test of insulation resistance, the insulation resistance was $4 \times 10^{12}$ Ω before the test and $4 \times 10^{12}$ Ω after the test. The degree of spreading by wetting of the Sn—Pb-based cocrystalline solder balls [manufactured by NITTETSU MICROMETAL Co., Ltd.] was 80%.

A test circuit having a land portion having a diameter of 300 μm and a pitch of 0.8 mm was formed. The surface for placing solder balls of a test package for testing soldering prepared in accordance with the same procedures as those conducted in Example 1 was coated with the varnish of a curable flux and a film of the curable flux having a thickness of 50 μm was formed. On the land portion of the circuit of the test package for evaluation of soldering, solder balls having a diameter of 500 μm [manufactured by SENJU KINZOKU KOGYO Co., Ltd.; an Sn—Pb-based cocrystalline solder] were placed and bonded to the test package for evaluation of soldering by passing through a reflow oven in which the peak temperature was set at 240° C. Using 800 solder balls in 10 packages prepared as described above, the resistance to electric current between the solder balls and the circuit of the test package was measured by a milliohm meter [manufactured by ADIRENT TECHNOLOGY Company; CABLE TESTER]. The resistance to electric current was 5 mΩ or smaller for all solder balls.

EXAMPLE 9

A varnish of a curable flux was prepared and evaluated in accordance with the same procedures as those conducted in Example 8 except that 100 g of a phenol novolak resin [manufactured by SUMITOMO DUREZ Co., Ltd.; PR-HF-3; the softening point: 82° C.; the hydroxyl equivalent: 105] was used in place of 100 g of the phenol novolak resin [manufactured by SUMITOMO DUREZ Co., Ltd.; LBR-6].

The average value of the shear strength of the solder balls was 800 g. No defects were found in the test of temperature cycles. In the test of insulation resistance, the insulation resistance was $5 \times 10^{12}$ Ω before the test and $4 \times 10^{12}$ Ω after the test. The degree of spreading by wetting of the solder balls was 75%. In the test of stability of soldering, the resistance to electric current was 5 mΩ or smaller for all solder balls.

EXAMPLE 10

A varnish of a curable flux was prepared and evaluated in accordance with the same procedures as those conducted in Example 8 except that 100 g of a phenol novolak resin [manufactured by SUMITOMO DUREZ Co., Ltd.; PR-51714; the softening point: 92° C.; the hydroxyl equivalent: 105] was used in place of 100 g of the phenol novolak resin [manufactured by SUMITOMO DUREZ Co., Ltd.; LBR-6].

The average value of the shear strength of the solder balls was 850 g. No defects were found in the test of temperature cycles. In the test of insulation resistance, the insulation resistance was $5 \times 10^{12}$ Ω before the test and $4 \times 10^{12}$ Ω after the test. The degree of spreading by wetting of the solder balls was 75%. In the test of stability of soldering, the resistance to electric current was 5 mΩ or smaller for all solder balls.

EXAMPLE 11

A varnish of a curable flux was prepared and evaluated in accordance with the same procedures as those conducted in Example 8 except that 100 g of a phenol novolak resin [manufactured by SUMITOMO DUREZ Co., Ltd.; PR-51470; the softening point: 109° C.; the hydroxyl equivalent: 105] was used in place of 100 g of the phenol novolak resin [manufactured by SUMITOMO DUREZ Co., Ltd.; LBR-6].

The average value of the shear strength of the solder balls was 800 g. No defects were found in the test of temperature cycles. In the test of insulation resistance, the insulation resistance was $4 \times 10^{12}$ Ω before the test and $3 \times 10^{12}$ Ω after the test. The degree of spreading by wetting of the solder balls was 70%. In the test of stability of soldering, the resistance to electric current was 5 mΩ or smaller for all solder balls.

EXAMPLE 12

Into 80 g of cyclohexanone, 100 g of a polyvinylphenol [manufactured by MARUZEN SEKIYU KAGAKU Co., Ltd.; MARUKALINKER M10819401; the softening point: 145° C.; the hydroxyl equivalent: 120] and 190 g of an epoxy resin of the diallylbisphenol A type [manufactured by NIPPON KAYAKU Co., Ltd.; RE-810NM; the epoxy equivalent: 220] were dissolved. To the resultant solution, 0.3 g of 2-phenyl-4,5-dihydroxymethylimidazole as the curing catalyst was added and a varnish of a curable flux was prepared. Then, the varnish was evaluated.

The average value of the shear strength of the solder balls was 800 g. No defects were found in the test of temperature cycles. In the test of insulation resistance, the insulation resistance was $4 \times 10^{12}$ Ω before the test and $3 \times 10^{12}$ Ω after the test. The degree of spreading by wetting of the solder balls was 60%. In the test of stability of soldering, the resistance to electric current exceeded 5 mΩ for some solder balls.

COMPARATIVE EXAMPLE 5

A varnish of a curable flux was prepared and evaluated in accordance with the same procedures as those conducted in Example 12 except that 100 g of another polyvinylphenol [manufactured by MARUZEN SEKIYU KAGAKU Co., Ltd.; MARUKALINKER M12880M801; the softening point: 195° C.; the hydroxyl equivalent: 120] was used in place of 100 g of the polyvinylphenol [manufactured by MARUZEN SEKIYU KAGAKU Co., Ltd.; MARUKALINKER M10819401].

The average value of the shear strength of the solder balls was 750 g. In the test of temperature cycles, defects of broken wiring were not found in 4 substrates among 10 substrates mounted with the test package. In the test of insulation resistance, the insulation resistance was $3 \times 10^{12}$ Ω before the test and $3 \times 10^{12}$ Ω after the test. The degree of spreading by wetting of the solder balls was 50% or smaller. In the test of stability of soldering, solder balls having poor bonding were found.

COMPARATIVE EXAMPLE 6

A varnish of a curable flux was prepared and evaluated in accordance with the same procedures as those conducted in Example 12 except that 100 g of another polyvinylphenol [manufactured by MARUZEN SEKIYU KAGAKU Co., Ltd.; MARUKALINKER M16917851; the softening point: 205° C.; the hydroxyl equivalent: 120] was used in place of 100 g of the polyvinylphenol [manufactured by MARUZEN SEKIYU KAGAKU Co., Ltd.; MARUKALINKER M10819401].

The average value of the shear strength of the solder balls was 700 g. In the test of temperature cycles, defects of broken wiring were found in 5 substrates among 10 substrates mounted with the test package. In the test of insulation resistance, the insulation resistance was $5 \times 10^{12}$ Ω before the test and $3 \times 10^{12}$ Ω after the test. The degree of spreading by wetting of the solder balls was 50% or smaller. In the test of stability of soldering, solder balls having poor bonding were found.

The results of Examples 8 to 12 and Comparative Examples 5 to 6 are shown in Table 3.

TABLE 3

| | Softening point (° C.) | Shear strength of solder balls (g) | Test of temperature cycles (defect/total) | Insulation resistance before test (Ω) | Insulation resistance after test (Ω) | Degree of spreading by wetting (%) | Stability of soldering |
|---|---|---|---|---|---|---|---|
| Example 8 | 41 | 900 | 0/10 | $4 \times 10^{12}$ | $4 \times 10^{12}$ | 80 | good |
| Example 9 | 82 | 800 | 0/10 | $5 \times 10^{12}$ | $4 \times 10^{12}$ | 75 | good |
| Example 10 | 92 | 850 | 0/10 | $5 \times 10^{12}$ | $4 \times 10^{12}$ | 75 | good |
| Example 11 | 109 | 800 | 0/10 | $4 \times 10^{12}$ | $3 \times 10^{12}$ | 70 | good |
| Example 12 | 145 | 800 | 0/10 | $4 \times 10^{12}$ | $3 \times 10^{12}$ | 60 | fair |
| Comparative Example 5 | 195 | 750 | 4/10 | $3 \times 10^{12}$ | $3 \times 10^{12}$ | <50 | poor |
| Comparative Example 6 | 205 | 700 | 5/10 | $5 \times 10^{12}$ | $3 \times 10^{12}$ | <50 | poor |

[Note]
In shear strength of solder balls, the diameter of the land portion was 300 μm.

As shown in Table 3, in Examples 8 to 12 in which the curable flux containing resins having phenolic hydroxyl group and a softening point of 41 to 145° C. was used, the shear strength of solder balls was great, no defects of broken wiring was found in the test of temperature cycles, the insulation resistance was high, the stability was excellent and the solder balls exhibited the excellent wetting property and excellent stability of bonding.

In contrast, in Comparative Examples 5 and 6 in which resins having an excessively high softening point was used for the curable flux, the properties were inferior in all cases, many defects of broken wiring were found in the test of temperature cycles and solder balls having poor bonding were found in the test of stability of soldering.

EXAMPLE 13

A solution prepared by dissolving hydroquinone [manufactured by ALDRICH Company] into acetone was mixed with n-hexane which was a poor solvent and fine crystals of hydroquinone having an average diameter of 10 μm were formed. The fine crystals of hydroquinone in an amount of 100 g was dispersed into 300 g of an epoxy resin of the bisphenol F type [manufactured by NIPPON KAYAKU Co., Ltd.; RE-404S; the epoxy equivalent: 165]. To the resultant dispersion, 0.2 g of 2-phenyl-4,5-dihydroxymethylimidazole as the curing catalyst was added and a curable flux was prepared. Then, the prepared curable flux was evaluated. As the package, a test package having a circuit in which the land portion had a diameter of 300 μm and a pitch of 0.8 mm was used.

The average value of the shear strength of the solder balls was 800 g. No defects were found in the test of temperature cycles. In the test of insulation resistance, the insulation resistance was $2 \times 10^{13}$ Ω before the test and $1 \times 10^{13}$ Ω after the test.

EXAMPLE 14

Ethylidenediphenol [manufactured by ALDRICH Company] was treated in the same manner as that treated in Example 13 and fine crystals having an average diameter of 8 μm were formed. The fine crystals of ethylidenediphenol in an amount of 100 g was dispersed into 200 g of an epoxy resin of the bisphenol F type [manufactured by NIPPON KAYAKU Co., Ltd.; RE-404S; the epoxy equivalent: 165]. To the resultant dispersion, 0.2 g of 2-phenyl-4,5-dihydroxymethylimidazole as the curing catalyst was added and a curable flux was prepared. The prepared curable flux was evaluated in accordance with the same method as that used in Example 13.

The average value of the shear strength of the solder balls was 900 g. No defects were found in the test of temperature cycles. In the test of insulation resistance, the insulation resistance was $6 \times 10^{13}$ Ω before the test and $3 \times 10^{13}$ Ω after the test.

EXAMPLE 15

Isopropylidenediphenol [manufactured by ALDRICH Company] was treated in the same manner as that treated in Example 13 and fine crystals having an average diameter of 12 μm were formed. The fine crystals of isopropylidenediphenol in an amount of 100 g was dispersed into 200 g of an epoxy resin of the bisphenol F type [manufactured by NIPPON KAYAKU Co., Ltd.; RE-404S; the epoxy equivalent: 165]. To the resultant dispersion, 0.2 g of 2-phenyl-4,5-dihydroxymethylimidazole as the curing catalyst was added and a curable flux was prepared. The prepared curable flux was evaluated in accordance with the same method as that used in Example 13.

The average value of the shear strength of the solder balls was 900 g. No defects were found in the test of temperature cycles. In the test of insulation resistance, the insulation resistance was $5 \times 10^{13}$ Ω before the test and $3 \times 10^{13}$ Ω after the test.

EXAMPLE 16

Dihydroxybenzoic acid [manufactured by ALDRICH Company] was treated in the same manner as that treated in Example 13 and fine crystals having an average diameter of 4 μm were formed. The fine crystals of dihydroxybenzoic acid in an amount of 100 g was dispersed into 330 g of an epoxy resin of the bisphenol F type [manufactured by NIPPON KAYAKU Co., Ltd.; RE-404S; the epoxy equivalent: 165]. To the resultant dispersion, 0.2 g of 2-phenyl-4, 5-dihydroxymethylimidazole as the curing catalyst was added and a curable flux was prepared. The prepared curable flux was evaluated in accordance with the same method as that used in Example 13.

The average value of the shear strength of the solder balls was 750 g. No defects were found in the test of temperature cycles. In the test of insulation resistance, the insulation resistance was $2\times10^{13}$ Ω before the test and $8\times10^{12}$ Ω after the test.

EXAMPLE 17

Phenolphthalin [manufactured by ALDRICH Company] was treated in the same manner as that treated in Example 13 and fine crystals having an average diameter of 7 μm were formed. The fine crystals of phenolphthalin in an amount of 100 g was dispersed into 200 g of an epoxy resin of the bisphenol F type [manufactured by NIPPON KAYAKU Co., Ltd.; RE-404S; the epoxy equivalent: 165]. To the resultant dispersion, 0.2 g of 2-phenyl-4,5-dihydroxymethylimidazole as the curing catalyst was added and a curable flux was prepared. The prepared curable flux was evaluated in accordance with the same method as that used in Example 13.

The average value of the shear strength of the solder balls was 850 g. No defects were found in the test of temperature cycles. In the test of insulation resistance, the insulation resistance was $3\times10^{13}$ Ω before the test and $1\times10^{13}$ Ω after the test.

The results of Examples 13 to 17 are shown in Table 4.

TABLE 4

| | Shear strength of solder balls (g) | Test of temperature cycles (defect/total) | Insulation resistance | |
| --- | --- | --- | --- | --- |
| | | | before test (Ω) | after test (Ω) |
| Example 13 | 800 | 0/10 | $2 \times 10^{13}$ | $1 \times 10^{13}$ |
| Example 14 | 900 | 0/10 | $6 \times 10^{13}$ | $3 \times 10^{13}$ |
| Example 15 | 900 | 0/10 | $5 \times 10^{13}$ | $3 \times 10^{13}$ |
| Example 16 | 750 | 0/10 | $2 \times 10^{13}$ | $8 \times 10^{12}$ |
| Example 17 | 850 | 0/10 | $3 \times 10^{13}$ | $1 \times 10^{13}$ |

[Note]
In shear strength of solder balls, the diameter of the land portion was 300 μm.

As shown in Table 4, in Examples 13 to 17 in which the curable flux contained the compound having phenolic hydroxyl group and dispersed as fine crystals and the epoxy resins of the bisphenol F type as the curing agent for the compound, the shear strength of the solder balls was great, no defects of broken wiring was found in the test of temperature cycles and the insulation resistance was remarkably high.

EXAMPLE 18

Into 60 g of ethyl acetoacetate, 100 g of a phenol novolak resin [manufactured by SUMITOMO DUREZ Co., Ltd.; PR-51470; the hydroxyl equivalent: 105], 20 g of ethylidenediphenol [manufactured by ALDRICH Company] and 300 g of an epoxy resin of the bisphenol F type [manufactured by NIPPON KAYAKU Co., Ltd.; RE-404S; the epoxy equivalent: 165] were dissolved. To the resultant solution, 0.2 g of 2-phenyl-4,5-dihydroxymethylimidazole as the curing catalyst was added and a varnish of a curable flux was prepared. The varnish was evaluated in accordance with the same method as that used in Example 13.

The average value of the shear strength of the solder balls was 900 g. No defects were found in the test of temperature cycles. In the test of insulation resistance, the insulation resistance was $2\times10^{13}$ Ω before the test and $1\times10^{13}$ Ω after the test.

EXAMPLE 19

A varnish of a curable flux was prepared and evaluated in accordance with the same procedures as those conducted in Example 18 except that 20 g of 4,4'-ethylidenebisphenyl cyanate [manufactured by ASAHI CIBA Co., Ltd.; AroCy L10] was used in place of 20 g of ethylidenediphenol.

The average value of the shear strength of the solder balls was 950 g. No defects were found in the test of temperature cycles. In the test of insulation resistance, the insulation resistance was $6\times10^{13}$ Ω before the test and $6\times10^{13}$ Ω after the test.

EXAMPLE 20

A varnish of a curable flux was prepared and evaluated in accordance with the same procedures as those conducted in Example 18 except that 20 g of phenolphthalin [manufactured by ALDRICH Company] was used in place of 20 g of ethylidenediphenol.

The average value of the shear strength of the solder balls was 1,000 g. No defects were found in the test of temperature cycles. In the test of insulation resistance, the insulation resistance was $3\times10^{13}$ Ω before the test and $3\times10^{13}$ Ω after the test.

EXAMPLE 21

A varnish of a curable flux was prepared and evaluated in accordance with the same procedures as those conducted in Example 18 except that 100 g of a m,p-cresol novolak resin [manufactured by NIPPON KAYAKU Co., Ltd.; PAS-1; the hydroxyl equivalent: 120] was used in place of 100 g of the phenol novolak resin and 20 g of phenolphthalin [manufactured by ALDRICH Company] was used in place of 20 g of ethylidenediphenol.

The average value of the shear strength of the solder balls was 900 g. No defects were found in the test of temperature cycles. In the test of insulation resistance, the insulation resistance was $4\times10^{13}$ Ω before the test and $2\times10^{13}$ Ω after the test.

The results of Examples 18 to 21 are shown in Table 5.

TABLE 5

| | Shear strength of solder balls (g) | Test of temperature cycles (defect/total) | Insulation resistance | |
| --- | --- | --- | --- | --- |
| | | | before test (Ω) | after test (Ω) |
| Example 18 | 900 | 0/10 | $2 \times 10^{13}$ | $1 \times 10^{13}$ |
| Example 19 | 950 | 0/10 | $6 \times 10^{13}$ | $6 \times 10^{13}$ |
| Example 20 | 1000 | 0/10 | $3 \times 10^{13}$ | $2 \times 10^{13}$ |
| Example 21 | 900 | 0/10 | $4 \times 10^{13}$ | $2 \times 10^{13}$ |

[Note]
In shear strength of solder balls, the diameter of the land portion was 300 μm.

As shown in Table 5, in Examples 18 to 21 in which resin (A) having phenolic hydroxyl group, curing agent (B) for resin (A) and curable antioxidant (C) were used, the curable flux exhibited the remarkably excellent shear strength of solder balls and insulation resistance.

INDUSTRIAL APPLICABILITY

The curable flux of the present invention does not require removal of residual flux by washing after the soldering, maintains the electric insulation under the atmosphere of a high temperature and a high humidity and enables the soldering exhibiting excellent bonding strength and excellent reliability since the curable flux is cured in a manner such that curable flux reinforces portions around the soldered portion in a ring shape. By using the curable flux of the present invention, the step of mounting a semiconductor package to a printed circuit board is simplified and the cost of production can be decreased. Therefore, the curable flux of the present invention is remarkably useful for enhancing the reliability of soldering in the semiconductor device.

What is claimed is:

1. A curable flux which works as a flux during soldering and as a reinforcing material for a soldered portion after being cured by heating and comprises resin (A) having phenolic hydroxyl group and curing agent (B) for the resin.

2. A curable flux according to claim 1, wherein resin (A) having phenolic hydroxyl group is a phenol novolak resin, an alkylphenol novolak resin, a polyhydric phenol novolak resin, a phenol aralkyl resin, a resol resin or a polyvinylphenol.

3. A curable flux according to claim 2, wherein a polyhydric phenol constituting the polyhydric phenol novolak resin is catechol, resorcinol, hydroquinone, hydroxyhydroquinone or pyrogallol.

4. A curable flux according to claim 1, wherein resin (A) having phenolic hydroxyl group has a softening point of 30 to 150° C.

5. A curable flux according to claim 1, wherein curing agent (B) is an epoxy compound or an isocyanate compound.

6. A curable flux according to claim 1, which further comprises curable antioxidant (C).

7. A curable flux according to claim 6, wherein curable antioxidant (C) is a compound having benzylidene structure.

8. A curable flux according to claim 7, wherein the compound having benzylidene structure is a compound represented by general formula [1]:

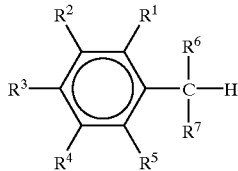

[1]

wherein $R^1$, $R^3$ and $R^5$ each independently represent hydrogen atom, hydroxyl group or carboxyl group, $R^2$ and $R^4$ each independently represent hydrogen atom or an alkyl group, $R^6$ and $R^7$ each independently represent hydrogen atom, methyl group, hydroxyphenyl group or carboxyphenyl group.

9. A curable flux according to claim 8, wherein the compound represented by general formula [1] is ethylidenediphenol or phenolphthalin.

10. A curable flux according to claim 6, wherein curable antioxidant (C) is 4,4'-ethylidenebisphenyl glycidyl ether.

11. A curable flux according to claim 1, which works as a flux during soldering and as a reinforcing material for a soldered portion after being cured by heating and comprises compound (D) having phenolic hydroxyl group and dispersed as fine crystals and curing agent (E) for compound (D).

12. A curable flux according to claim 11, wherein the fine crystals have a diameter of 50 μm or smaller.

13. A curable flux according to claim 1, wherein a contact angle between the flux in a melted condition and a surface of a solder is 5 to 60°.

14. A curable flux according to claim 1, which has a melt viscosity of 0.1 mPa·s to 50 Pa·s at a temperature during soldering.

15. A curable flux according to claim 1, which has a gel time of 1 to 60 minutes at a melting point of a solder.

16. A resist for soldering which is applied to coat a circuit pattern having a land for placing solder balls, is cured by heating after soldering with the solder balls by solder reflow and works as a resist for the circuit pattern.

17. A resist for soldering according to claim 16, which forms a ring-shaped meniscus around a portion for soldering and is cured into a form such that the cured resist reinforces a soldered portion.

18. A semiconductor package which comprises a curable flux described in claim 1 which is applied to coat an exposed surface of a circuit, works as a flux of soldering during soldering with solder balls, forms a ring-shaped meniscus around a portion for soldering during soldering and is cured by heating after soldering with the solder balls so that a portion soldered with the solder balls is reinforced with the cured flux.

19. A semiconductor device which comprises a curable flux described in claim 1 which is applied to coat a printed circuit board having a land for soldering, works as a flux of soldering during soldering, forms a ring-shaped meniscus around a portion for soldering during soldering and is cured by heating after the soldering so that a soldered portion is reinforced with the cured flux.

20. A semiconductor device according to claim 19, wherein the curable flux is applied to coat an entire surface of the printed circuit board having a land for soldering and is cured by heating after the soldering so that the cured flux works as a resist for the printed circuit board.

21. A process for producing a semiconductor package which comprises coating an exposed surface of a circuit with a curable flux described in claim 1, placing solder balls on the exposed surface, bonding the solder balls to the exposed portion by reflow and, after forming a ring-shaped meniscun around a portion for soldering, curing the curable flux by heating.

22. A process for producing a semiconductor package which comprises a step of transferring a curable flux described in claim 1 in a prescribed amount to solder balls and placing the solder balls having the transferred curable flux on a land portion; a step of soldering the solder balls to the land for placing the solder balls by solder reflow and forming a meniscus with the curable flux around a portion soldered with the solder balls; and a step of curing the curable flux by heating so that a structure in which the portion soldered with the solder balls is reinforced with the cured resin is constructed.

23. A process for producing a semiconductor apparatus which comprises applying a curable flux described in claim 1 to coat a printed circuit board, placing on the board a semiconductor package having solder balls on an electrode portion of a chip, bonding the solder balls to a land of the board by reflow and curing the curable flux by heating.

24. A curable flux according to claim 11, wherein a contact angle between the flux in a melted condition and a surface of a solder is 5 to 60°.

25. A curable flux according to claim 11, which has a melt viscosity of 0.1 mPa·s to 50 Pa·s at a temperature during soldering.

26. A curable flux according to claim 11, which has a gel time of 1 to 60 minutes at a melting point of a solder.

27. A semiconductor package which comprises a curable flux described in claim 6 which is applied to coat an exposed surface of a circuit, works as a flux of soldering during soldering with solder balls, forms a ring-shaped meniscus around a portion for soldering during soldering and is cured by heating after soldering with the solder balls so that a portion soldered with the solder balls is reinforced with the cured flux.

28. A semiconductor package which comprises a curable flux described in claim 11 which is applied to coat an exposed surface of a circuit, works as a flux of soldering during soldering with solder balls, forms a ring-shaped meniscus around a portion for soldering during soldering and is cured by heating after soldering with the solder balls so that a portion soldered with the solder balls is reinforced with the cured flux.

29. A semiconductor device which comprises a curable flux described in claim 6 which is applied to coat a printed circuit board having a land for soldering, works as a flux of soldering during soldering, forms a ring-shaped meniscus around a portion for soldering during soldering and is cured by heating after the soldering so that a soldered portion is reinforced with the cured flux.

30. A semiconductor device which comprises a curable flux described in claim 11 which is applied to coat a printed circuit board having a land for soldering, works as a flux of soldering during soldering, forms a ring-shaped meniscus around a portion for soldering during soldering and is cured by heating after the soldering so that a soldered portion is reinforced with the cured flux.

31. A process for producing a semiconductor package which comprises coating an exposed surface of a circuit with a curable flux described in claim 6, placing solder balls on the exposed surface, bonding the solder balls to the exposed portion by reflow and, after forming a ring-shaped meniscun around a portion for soldering, curing the curable flux by heating.

32. A process for producing a semiconductor package which comprises coating an exposed surface of a circuit with a curable flux described in claim 11, placing solder balls on the exposed surface, bonding the solder balls to the exposed portion by reflow and, after forming a ring-shaped meniscun around a portion for soldering, curing the curable flux by heating.

33. A process for producing a semiconductor package which comprises a step of transferring a curable flux described in claim 6 in a prescribed amount to solder balls and placing the solder balls having the transferred curable flux on a land portion; a step of soldering the solder balls to the land for placing the solder balls by solder reflow and forming a meniscus with the curable flux around a portion soldered with the solder balls; and a step of curing the curable flux by heating so that a structure in which the portion soldered with the solder balls is reinforced with the cured resin is constructed.

34. A process for producing a semiconductor package which comprises a step of transferring a curable flux described in claim 11 in a prescribed amount to solder balls and placing the solder balls having the transferred curable flux on a land portion; a step of soldering the solder balls to the land for placing the solder balls by solder reflow and forming a meniscus with the curable flux around a portion soldered with the solder balls; and a step of curing the curable flux by heating so that a structure in which the portion soldered with the solder balls is reinforced with the cured resin is constructed.

35. A process for producing a semiconductor apparatus which comprises applying a curable flux described in claim 6 to coat a printed circuit board, placing on the board a semiconductor package having solder balls on an electrode portion of a chip, bonding the solder balls to a land of the board by reflow and curing the curable flux by heating.

36. A process for producing a semiconductor apparatus which comprises applying a curable flux described in claim 11 to coat a printed circuit board, placing on the board a semiconductor package having solder balls on an electrode portion of a chip, bonding the solder balls to a land of the board by reflow and curing the curable flux by heating.

* * * * *